(12) United States Patent
Yoneyama

(10) Patent No.: US 11,543,451 B2
(45) Date of Patent: Jan. 3, 2023

(54) REAL-TIME CLOCK MODULE, ELECTRONIC DEVICE AND VEHICLE

(71) Applicant: SEIKO EPSON CORPORATION, Tokyo (JP)

(72) Inventor: Tsuyoshi Yoneyama, Matsukawa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 375 days.

(21) Appl. No.: 16/800,025

(22) Filed: Feb. 25, 2020

(65) Prior Publication Data

US 2020/0271721 A1    Aug. 27, 2020

(30) Foreign Application Priority Data

Feb. 26, 2019  (JP) .............................. JP2019-032546

(51) Int. Cl.

| G01R 31/317 | (2006.01) |
|---|---|
| G06F 1/14 | (2006.01) |
| H03B 5/32 | (2006.01) |
| H03K 17/22 | (2006.01) |
| H03B 5/04 | (2006.01) |
| H03B 5/12 | (2006.01) |

(52) U.S. Cl.
CPC .................. G01R 31/31703 (2013.01); G01R 31/31727 (2013.01); G06F 1/14 (2013.01); H03B 5/32 (2013.01); H03B 5/04 (2013.01); H03B 5/12 (2013.01); H03K 17/22 (2013.01)

(58) Field of Classification Search
CPC ........ G01R 31/31703; G01R 31/31727; G06F 1/14; H03B 5/32; H03B 5/04; H03B 5/12; H03K 17/22

USPC .............................................. 714/731; 702/57
See application file for complete search history.

(56) References Cited

U.S. PATENT DOCUMENTS

| 2009/0022013 | A1 | 1/2009 | Shirotori et al. | |
|---|---|---|---|---|
| 2009/0085685 | A1* | 4/2009 | Guo ......................... | H03L 1/02 331/185 |
| 2011/0280109 | A1* | 11/2011 | Raymond .............. | G04G 7/005 327/160 |
| 2016/0285464 | A1* | 9/2016 | Obata ..................... | H03B 5/36 |
| 2017/0063305 | A1* | 3/2017 | Shirotori .................. | H03L 1/02 |

(Continued)

FOREIGN PATENT DOCUMENTS

| JP | H04-111138 A | 4/1992 |
|---|---|---|
| JP | H06-175888 A | 6/1994 |

(Continued)

*Primary Examiner* — John J Tabone, Jr.
(74) *Attorney, Agent, or Firm* — Rankin, Hill & Clark LLP

(57) ABSTRACT

A real-time clock module includes an oscillation circuit, a storage unit that stores adjustment data used to adjust an oscillation frequency of the oscillation circuit, a data abnormality determination circuit that compares first data based on the adjustment data with second data based on the adjustment data to determine whether or not at least one of the first data and the second data is abnormal, and a flag register that holds a data abnormality flag in which a first value indicating that the first data and the second data are normal, or a second value indicating that at least one of the first data and the second data is abnormal is set, based on a signal from the data abnormality determination circuit.

11 Claims, 12 Drawing Sheets

(56) References Cited

U.S. PATENT DOCUMENTS

| | | | | |
|---|---|---|---|---|
| 2017/0063380 A1* | 3/2017 | Shirotori | ............ | H03B 5/32 |
| 2017/0153661 A1* | 6/2017 | Kamiyama | ............ | G06F 1/14 |
| 2017/0272082 A1* | 9/2017 | Obata | ............ | H03L 1/028 |
| 2018/0210488 A1* | 7/2018 | Kiya | ............ | G07C 5/085 |
| 2018/0356855 A1* | 12/2018 | Kamiyama | ............ | G04C 9/00 |
| 2020/0271721 A1* | 8/2020 | Yoneyama | ............ | H03B 5/32 |

FOREIGN PATENT DOCUMENTS

| | | |
|---|---|---|
| JP | 2007-026028 A | 2/2007 |
| JP | 2009-038432 A | 2/2009 |
| JP | 2011-154582 A | 8/2011 |
| JP | 2013-089107 A | 5/2013 |
| JP | 2013-152733 A | 8/2013 |
| JP | 2014-075065 A | 4/2014 |
| JP | 2018-106337 A | 7/2018 |

\* cited by examiner

| DM1 | FREQUENCY ADJUSTMENT DATA |
|---|---|
| DM2 | VOSC ADJUSTMENT DATA |
| DM3 | VLOGIC ADJUSTMENT DATA |
| DM4 | BIAS CURRENT ADJUSTMENT DATA |
| DM5 | VOLTAGE DROP DETECTION THRESHOLD ADJUSTMENT DATA |
| DM6 | IC CODE DATA |
| DM7 | RTC CODE DATA |

REAL-TIME CLOCK MODULE, ELECTRONIC DEVICE AND VEHICLE

The present application is based on, and claims priority from JP Application Serial Number 2019-032546, filed Feb. 26, 2019, the disclosure of which is hereby incorporated by reference herein in its entirety.

BACKGROUND

1. Technical Field

The present disclosure relates to a real-time clock module, an electronic device, and a vehicle.

2. Related Art

JP-A-2009-038432 discloses a real-time clock device including a temperature compensated oscillation circuit that stops the operation of a compensation circuit when the voltage supplied from the outside becomes a reference voltage or lower and changes the value of a temperature compensation flag to a value indicating that the operation of the temperature compensation circuit has stopped.

However, the real-time clock device described in JP-A-2009-038432 can detect a drop in the power supply voltage, but cannot detect an abnormality occurring in the adjustment data used for adjusting the oscillation frequency.

SUMMARY

An aspect of a real-time clock module according to the present disclosure includes an oscillation circuit, a storage unit that stores adjustment data used to adjust an oscillation frequency of the oscillation circuit, a data abnormality determination circuit that compares first data based on the adjustment data with second data based on the adjustment data to determine whether or not at least one of the first data and the second data is abnormal, and a flag register that holds a data abnormality flag in which a first value indicating that the first data and the second data are normal, or a second value indicating that at least one of the first data and the second data is abnormal is set, based on a signal from the data abnormality determination circuit.

The aspect of the real-time clock module may further include a first data register to which the adjustment data is loaded from the storage unit, and a second data register to which the adjustment data is loaded from the storage unit, in which the first data may be data output from the first data register, and the second data may be data output from the second data register.

In the aspect of the real-time clock module, the adjustment data may be periodically loaded from the storage unit to the second data register.

The aspect of the real-time clock module may further include a data register to which the adjustment data is loaded from the storage unit, in which the first data may be data output from the data register, and the second data may be the adjustment data stored in the storage unit.

The aspect of the real-time clock module may further include a time register that holds time information when the data abnormality flag is changed from the first value to the second value.

In the aspect of the real-time clock module, the data abnormality determination circuit may include a pulse signal generation circuit that generates a pulse signal when the first data and the second data do not match, and the data abnormality flag may be changed from the first value to the second value based on the pulse signal.

An aspect of a real-time clock module according to the present disclosure includes an oscillation circuit, a storage unit that stores adjustment data used to adjust an oscillation frequency of the oscillation circuit, a first data register to which the adjustment data is loaded from the storage unit, a second data register to which the adjustment data is loaded from the storage unit, a first data abnormality determination circuit that compares first data output from the first data register with second data output from the second data register to determine whether or not at least one of the first data and the second data is abnormal, a second data abnormality determination circuit that compares the second data with third data which is the adjustment data stored in the storage unit to determine whether or not at least one of the second data and the third data is abnormal, a first flag register that holds a first data abnormality flag in which a first value indicating that the first data and the second data are normal, or a second value indicating that at least one of the first data and the second data is abnormal is set, based on a signal from the first data abnormality determination circuit, and a second flag register that holds a second data abnormality flag in which a third value indicating that the second data and the third data are normal, or a fourth value indicating that at least one of the second data and the third data is abnormal is set, based on a signal from the second data abnormality determination circuit.

The aspect of the real-time clock module may further include a time register that holds time information when the first data abnormality flag is changed from the first value to the second value or when the second data abnormality flag is changed from the third value to the fourth value.

In the aspect of the real-time clock module, the first data abnormality determination circuit may include a first pulse signal generation circuit that generates a first pulse signal when the first data and the second data do not match, the second data abnormality determination circuit may include a second pulse signal generation circuit that generates a second pulse signal when the second data and the third data do not match, the first data abnormality flag may be changed from the first value to the second value based on the first pulse signal, and the second data abnormality flag may be changed from the third value to the fourth value based on the second pulse signal.

An aspect of an electronic device according to the present disclosure includes the aspect of the real-time clock module, and a processing circuit that operates based on an output signal from the real-time clock module.

An aspect of a vehicle according to the present disclosure includes the aspect of the real-time clock module, and a processing circuit that operates based on an output signal from the real-time clock module.

DESCRIPTION OF EXEMPLARY EMBODIMENTS

Hereinafter, preferred embodiments of the disclosure will be described in detail with reference to drawings. The embodiments described below do not unduly limit the contents of the disclosure described in the appended claims. Also, not all of the configurations described below are essential constituent requirements of the disclosure.

1. Real-Time Clock Module

1-1. First Embodiment

Figure 1:
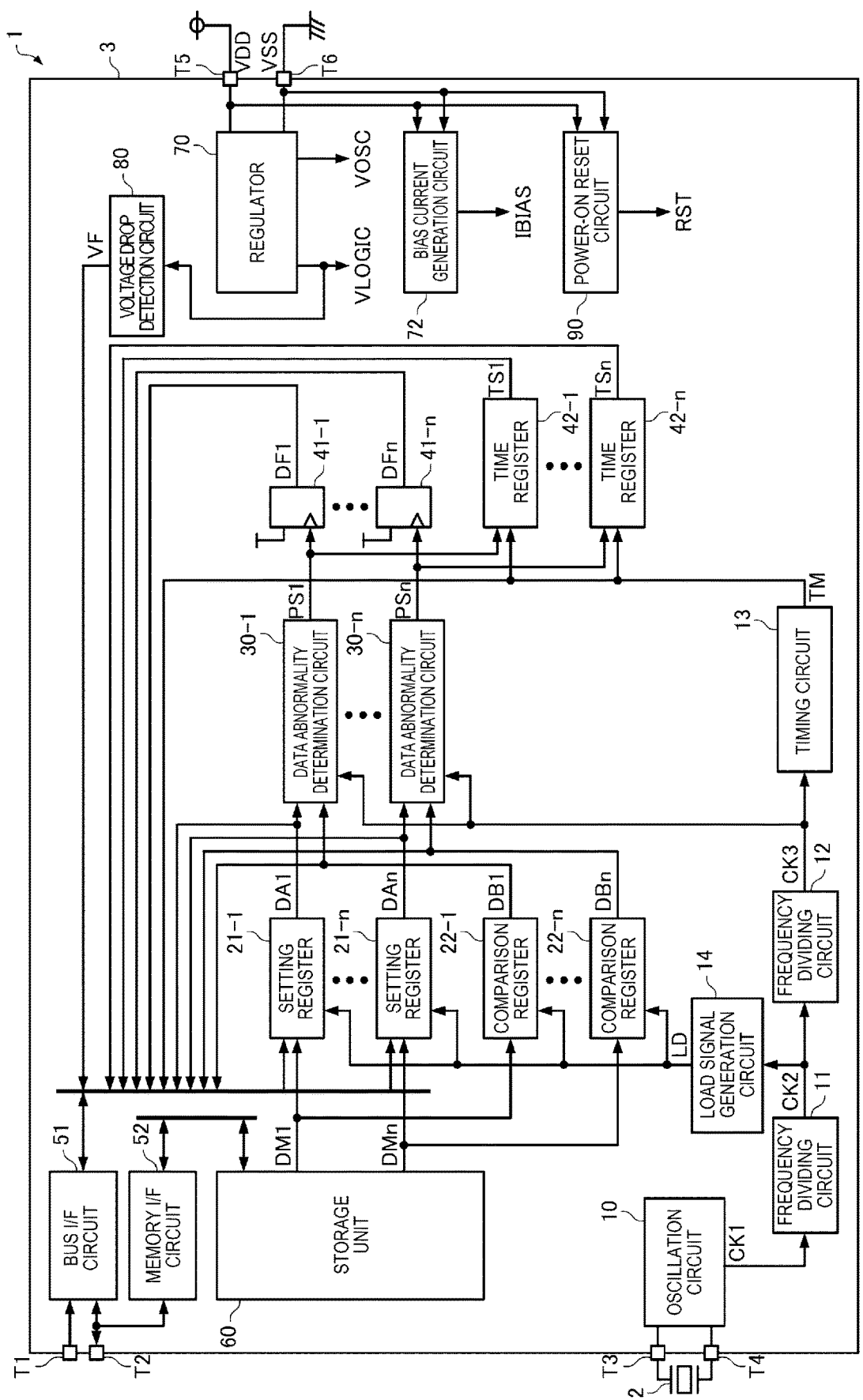
FIG. 1 is a functional block diagram of a real-time clock module according to a first embodiment.

FIG. 1 is a functional block diagram of a real-time clock module 1 of a first embodiment. As illustrated in FIG. 1, the real-time clock module 1 includes a resonator 2 and an integrated circuit 3.

The resonator 2 may be a tuning fork type quartz crystal resonator, an AT cut quartz crystal resonator, an SC cut quartz crystal resonator, or a piezoelectric resonator other than a surface acoustic wave (SAW) resonator or a quartz crystal resonator. The resonator 2 may be a micro electro mechanical systems resonator (MEMS) made of a silicon semiconductor. The resonator 2 may be excited by a piezo-electric effect or may be driven by a Coulomb force (electrostatic force).

The integrated circuit 3 includes an oscillation circuit 10, a frequency dividing circuit 11, a frequency dividing circuit 12, a timing circuit 13, a load signal generation circuit 14, n setting registers 21-1 to 21-n, n comparison registers 22-1 to 22-n, n data abnormality determination circuits 30-1 to 30-n, n flag registers 41-1 to 41-n, n time registers 42-1 to 42-n, a bus interface circuit 51, a memory interface circuit 52, a storage unit 60, a regulator 70, a bias current generation circuit 72, a voltage drop detection circuit 80, and a power-on reset circuit 90. However, the integrated circuit 3 may have a configuration in which some of these elements are omitted or changed, or other elements are added.

Based on a power supply voltage VDD supplied via a terminal T5 of the integrated circuit 3 and a ground voltage VSS supplied via a terminal T6 of the integrated circuit 3, the power-on reset circuit 90 generates a pulsed reset signal RST until the power supply voltage VDD reaches a desired voltage from 0V. Each circuit of the integrated circuit 3 is initialized by the reset signal RST.

The regulator 70 generates a stabilized voltage VOSC and voltage VLOGIC having predetermined voltage values based on the power supply voltage VDD and the ground voltage VSS. In the embodiment, the voltage VOSC is lower than the voltage VLOGIC.

The bias current generation circuit 72 generates a bias current IBIAS for operating the oscillation circuit 10, the regulator 70, and the voltage drop detection circuit 80 based on the power supply voltage VDD and the ground voltage VSS.

Although not illustrated in FIG. 1, the ground voltage VSS is supplied to each circuit of the integrated circuit 3.

The voltage drop detection circuit 80 monitors the voltage VLOGIC, detects that the voltage VLOGIC has dropped below a predetermined voltage threshold, and sets a voltage drop flag VF to □1□. Here, for example, the predetermined voltage threshold is set to a lower limit value of the operation guarantee voltage of a circuit that operates by using the voltage VLOGIC such as the time circuit 13 as a power supply voltage. Therefore, the voltage drop flag VF being □1□ indicates that the reliability of timing data TM generated by the timing circuit 13 is slightly low.

The oscillation circuit 10 is electrically connected to both ends of the resonator 2 via terminals T3 and T4 of the integrated circuit 3. The oscillation circuit 10 operates by using the voltage VOSC supplied from the regulator 70 as a power supply voltage, amplifies and feeds back the output signal of the resonator 2, and thereby oscillates the resonator 2 to generate a clock signal CK1.

The frequency dividing circuit 11 operates by using the voltage VOSC as a power supply voltage and generates a clock signal CK2 having a desired frequency by dividing the clock signal CK1. For example, the frequency dividing circuit 11 may be a ripple counter in which N flip-flops are connected in series with a frequency dividing ratio of 2 to the N-th power.

Since the oscillation circuit 10 and the frequency dividing circuit 11 operate at a relatively high speed as compared with other circuits, the power supply voltage of the oscillation circuit 10 and the frequency dividing circuit 11 is set to the voltage VOSC lower than the voltage VLOGIC so that the power consumption of the oscillation circuit 10 and the frequency dividing circuit 11 is reduced.

The frequency dividing circuit 12 operates by using the voltage VLOGIC as a power supply voltage and generates a clock signal CK3 having a desired frequency by dividing the clock signal CK2. For example, the frequency dividing circuit 12 may be a ripple counter in which M flip-flops are connected in series with a frequency dividing ratio of 2 to the M-th power.

The timing circuit 13 operates by using the voltage VLOGIC as a power supply voltage, and generates clock data TM representing, for example, year, month, day of the week, day, hour, minute, and second by performing a timing operation based on the clock signal CK3. For example, the frequency of the clock signal CK3 is 1 Hz, and the timing circuit 13 may output a carry signal every time the number of pulses of the clock signal CK3 is counted 60 times and may calculate the time in seconds based on the count value of the second counter to be reset. The timing circuit 13 may output a carry signal every time the number of carry signals from the second counter is counted 60 times and may calculate the time in minutes based on the count value of the minute counter to be reset. The timing circuit 13 may calculate time in units of hours, days, days of the week, months, and years in the same manner as the time in minutes. The timing circuit 13 may calculate time in units of less than 1 second, for example, 1/100 second unit or 1/1000 second unit. In this case, the frequency of the clock signal CK3 may be higher than 1 Hz.

The timing circuit 13 may include a temperature compensation circuit that compensates for the frequency temperature characteristics of the oscillation circuit 10 in order to realize highly accurate timing.

The storage unit 60 is a non-volatile memory and stores n pieces of data DM1 to DMn. The data DM1 to DMn are various data such as adjustment data used for adjusting each circuit. In particular, in the embodiment, the data DM1 is adjustment data used for adjusting the oscillation frequency of the oscillation circuit 10. The storage unit 60 may be, for example, various rewritable nonvolatile memories such as an electrically erasable programmable read-only memory (EEPROM) or a flash memory, or may be various non-rewritable nonvolatile memories such as a one-time programmable read only memory (PROM).

Figures 2, 3:
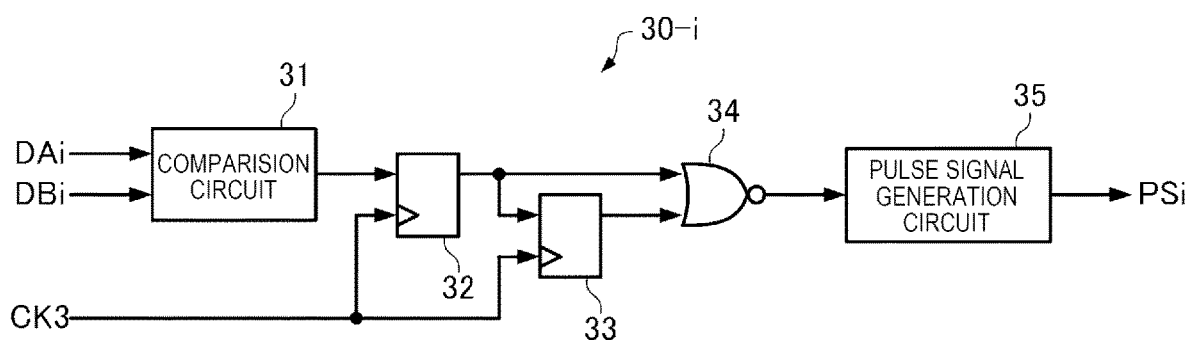
FIG. 2 is a diagram illustrating an example of data stored in a storage unit.
FIG. 3 is a diagram illustrating a configuration example of a data abnormality determination circuit.

FIG. 2 is a diagram illustrating an example of data stored in the storage unit 60. In the example of FIG. 2, n is 7, and the storage unit 60 stores seven pieces of data DM1 to DM7.

In the example of FIG. 2, the data DM1 is adjustment data used for adjusting the oscillation frequency of the oscillation circuit 10, and is frequency adjustment data for adjusting the oscillation circuit 10 so that the oscillation frequency of the oscillation circuit 10 becomes a desired frequency. The data DM2 is VOSC adjustment data for adjusting the regulator 70 so that the voltage VOSC becomes a desired voltage value. The data DM3 is VLOGIC adjustment data for adjusting the regulator 70 so that the voltage VLOGIC becomes a desired voltage value. The data DM4 is bias current adjustment data for adjusting the bias current generation circuit 72 so that the bias current IBIAS becomes a desired current value. The data DM5 is voltage drop detection threshold value adjustment data for adjusting the voltage drop detection circuit 80 so that the voltage threshold value of the voltage drop detection circuit 80 becomes a desired value. The data DM6 is IC code data including the manufacturing lot number and manufacturing date information of the integrated circuit 3. The data DM7 is RTC code data including the manufacturing lot number and manufacturing date information of the real-time clock module 1.

Returning to FIG. 1, the load signal generation circuit 14 operates by using the voltage VLOGIC as a power supply voltage, counts the number of pulses of the clock signal CK2, and sets the load signal LD to a high level for one pulse of the clock signal CK2 when the count value reaches a predetermined value. The time from when the load signal generation circuit 14 starts counting the number of pulses of the clock signal CK2 until the count value reaches the predetermined value is set to a time longer than the time required until the oscillation operation of the oscillation circuit 10 is stabilized after the supply of the power supply voltage VDD to the integrated circuit 3 is started.

The n setting registers 21-1 to 21-n operate by using the voltage VLOGIC as a power supply voltage, and n pieces of data DM1 to DMn are loaded from the storage unit 60, respectively. The setting registers 21-1 to 21-n output the held data as data DA1 to DAn, respectively. The setting registers 21-1 to 21-n are registers that can be rewritten by an external device (not illustrated) via the bus interface circuit 51.

The n comparison registers 22-1 to 22-n operate by using the voltage VLOGIC as a power supply voltage, and n pieces of data DM1 to DMn are loaded from the storage unit 60, respectively. The comparison registers 22-1 to 22-n output the held data as data DB1 to DBn, respectively. The comparison registers 22-1 to 22-n are registers that cannot be rewritten by an external device (not illustrated) via the bus interface circuit 51.

In the embodiment, when the load signal LD changes from a low level to a high level, the setting registers 21-1 to 21-n are loaded with n pieces of data DM1 to DMn, respectively, and the comparison registers 22-1 to 22-n are loaded with n pieces of data DM1 to DMn, respectively.

When i is an arbitrary integer between 1 and n, the data abnormality determination circuit 30-i operates by using the voltage VLOGIC as a power supply voltage and compares the data DAi output from the setting register 21-i with the data DBi output from the comparison register 22-i in synchronization with the clock signal CK3 to determine whether or not at least one of the data DAi and the data DBi is abnormal. The data abnormality determination circuit 30-i outputs a pulse signal PSi when it is determined that at least one of the data DAi and the data DBi is abnormal. The circuit configurations of the data abnormality determination circuits 30-1 to 30-n may be the same. FIG. 3 is a diagram illustrating a configuration example of the data abnormality determination circuit 30-i. i is an arbitrary integer from 1 to n.

In the example of FIG. 3, the data abnormality determination circuit 30-i includes a comparison circuit 31, a flip-flop 32, a flip-flop 33, a NOR circuit 34, and a pulse signal generation circuit 35.

The comparison circuit 31 compares the data DAi with the data DBi, and outputs data that is at the high level when the data DAi and the data DBi match, and outputs data that is at the low level when the data DAi and the data DBi do not match.

The flip-flop 32 holds the data output from the comparison circuit 31 every time the pulse of the clock signal CK3 rises and outputs the held data.

The flip-flop 33 holds the data output from the flip-flop 32 every time the pulse of the clock signal CK3 rises and outputs the held data.

Although not illustrated, when the reset signal RST is at a high level, the data held by the flip-flops 32 and 33 is initialized to a high level.

The NOR circuit 34 outputs a signal that is at the low level when at least one of the data output from the flip-flop 32 and the data output from the flip-flop 33 is at the high level and outputs a signal that is at the high level when both the data output from the flip-flop 32 and the data output from the flip-flop 33 are at the low level. When the data DAi and the data DBi do not match for one cycle of the clock signal CK3, the output signal of the NOR circuit 34 changes from the low level to the high level.

The pulse signal generation circuit 35 generates a pulse signal PSi that becomes the high level for a certain time when the output signal of the NOR circuit 34 changes from the low level to the high level. The pulse signal generation circuit 35 is realized by, for example, a delay circuit that delays the output signal of the NOR circuit 34, and an EXOR circuit that receives the output signal of the NOR circuit 34 and the output signal of the delay circuit and outputs the pulse signal PSi.

When the data DAi and the data DBi do not match, since the output signal of the NOR circuit 34 changes from the low level to the high level, the pulse signal generation circuit 35 generates the pulse signal PSi when the data DAi and the data DBi do not match. The fact that the data DAi and the data DBi do not match indicates that at least one of the data DAi and the data DBi does not match the data DMi, that is, at least one of the data DAi and the data DBi is abnormal. Therefore, the data abnormality determination circuit 30-*i* generates the pulse signal PSi when it is determined that at least one of the data DAi and the data DBi is abnormal.

Returning to FIG. 1, when i is an arbitrary integer between 1 and n, the flag register 41-*i* operates by using the voltage VLOGIC as a power supply voltage and holds a data abnormality flag DFi in which a first value indicating that the data DAi and the data DBi are normal, or a second value indicating that at least one of the data DAi and the data DBi is abnormal is set, based on the signal from the data abnormality determination circuit 30-*i*. Specifically, the data abnormality flag DFi is changed from the first value to the second value based on the pulse signal PSi output from the data abnormality determination circuit 30-*i*. In the embodiment, the flag register 41-*i* is realized by a flip-flop that holds high-level data at the rising edge of the pulse signal PSi. Although not illustrated, when the reset signal RST is at the high level, the data held in the flag registers 41-1 to 41-*n* is initialized to the low level.

As described above, the data abnormality determination circuit 30-*i* generates the pulse signal PSi when it is determined that at least one of the data DAi and the data DBi is abnormal. Therefore, in the embodiment, the first value set in the data abnormality flag DFi and indicating that the data DAi and the data DBi are normal is □0□ corresponding to the low level. The second value set in the data abnormality flag DFi and indicating that at least one of the data DAi and the data DBi is abnormal is □0□ corresponding to the high level.

When i is an arbitrary integer between 1 and n, the time register 42-*i* operates by using the voltage VLOGIC as a power supply voltage and holds time information TSi when the data abnormality flag DFi is changed from the first value to the second value. Specifically, the time register 42-*i* captures the timing data TM at the rising edge of the pulse signal PSi and holds the timing data TM as time information TSi. Therefore, when the data abnormality flag DFi is the second value, the time information TSi is information indicating the time when the data abnormality determination circuit 30-*i* determines that at least one of the data DAi and the data DBi is abnormal.

The bus interface circuit 51 and the memory interface circuit 52 are interface circuits that operate by using the voltage VLOGIC as a power supply voltage and perform data communication with an external device (not illustrated) via the terminals T1 and T2 of the integrated circuit 3. The bus interface circuit 51 receives various register access commands from an external device, and writes data to the setting registers 21-1 to 21-*n* or reads the timing data TM, the data DA1 to DAn, the data DB1 to DBn, the data abnormality flags DF1 to DFn, the time information TS1 to TSn, and the like in accordance with the received commands. The memory interface circuit 52 receives various memory access commands from the external device, and writes and reads data DM1 to DMn to and from the storage unit 60 in accordance with the received commands. For example, in the inspection process of the integrated circuit 3 or the real-time clock module 1, the external device searches for the optimum value for adjusting each circuit of the integrated circuit 3 while rewriting the data DA1 to DAn in the setting registers 21-1 to 21-*n* via the bus interface circuit 51 and writes the obtained optimum value data DM1 to DMn to the storage unit 60 via the memory interface circuit 52.

The bus interface circuit 51 and the memory interface circuit 52 are interface circuits compatible with, for example, an inter-integrated circuit (I2C) bus. A serial clock signal is input from the external device to the terminal T1, and serial data is input to and output from the external device via the terminal T2. However, the bus interface circuit 51 and the memory interface circuit 52 may be interface circuits compatible with various serial buses such as a serial peripheral interface (SPI) bus other than the I2C bus, or may be interface circuits compatible with a parallel bus.

In the example of FIG. 1, the setting register 21-1 corresponds to a □first data register□, and the comparison register 22-1 corresponds to a □second data register□. The data DA1 output from the setting register 21-1 is data based on the data DM1 that is adjustment data used for adjusting the oscillation frequency of the oscillation circuit 10 and corresponds to □first data□. The data DB1 output from the comparison register 22-1 is data based on the data DM1 that is adjustment data used to adjust the oscillation frequency of the oscillation circuit 10 and corresponds to □second data□.

Figure 4:
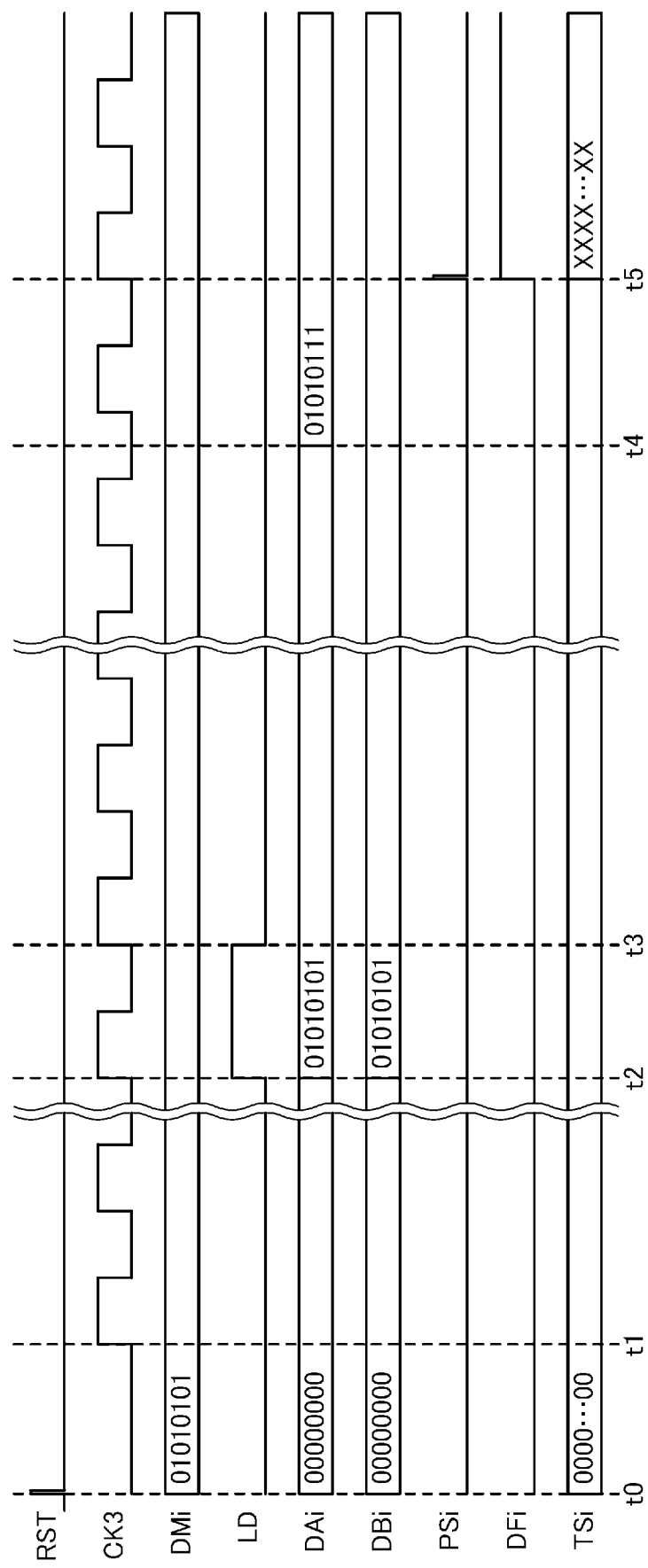
FIG. 4 is a timing chart illustrating an example of an operation of the data abnormality determination circuit.

FIG. 4 is a timing chart illustrating an example of the operation of the data abnormality determination circuit 30-*i*. i is an arbitrary integer from 1 to n. In the example of FIG. 4, the data DMi □10101010□ is stored in the storage unit 60.

First, the reset signal RST is generated at time t0. As a result, the data DAi and the data DBi are initialized to □00000000□, respectively. The load signal LD and the pulse signal PSi are each initialized to the low level. The data abnormality flag DFi is initialized to □0□. The time information TSi is initialized to □0000 . . . 00□.

Next, at time t1, the first pulse of the clock signal CK3 is generated. When a predetermined number of pulses of the clock signal CK3 are generated, the load signal LD changes from the low level to the high level at the rising edge of the clock signal CK3 at time t2. As a result, the data DMi is loaded into the setting register 21-*i* and the comparison register 22-*i*, and the data DAi and the data DBi change from □00000000□ to □01010101□, respectively.

Next, at time t3, the load signal LD changes from the high level to the low level at the rising edge of the next pulse of the clock signal CK3.

Next, at time t4, a part of bit values of the data DAi changes for some reason, and when the data DAi changes from □01010101□ to □01010111□, at time t5, the pulse signal PSi is generated at the rising edge after two pulses of the clock signal CK3. As a result, the data abnormality flag DFi changes from □0□ to □1□, the timing data TM is captured into the time register 42-*i*, and the time information TSi changes from □0000 . . . 00□ to □XXXX□XX□.

For example, the external device can periodically read the data abnormality flag DFi via the bus interface circuit 51 and recognize that at least one of the data DAi and the data DBi is abnormal when the data abnormality flag DFi is first read after time t5. The external device can recognize the time when it is determined that at least one of the data DAi and the data DBi is abnormal, that is, the time when the reliability of the timing data TM has decreased, by reading the time information TSi via the bus interface circuit 51.

If the value of the data DMi stored in the storage unit 60 is recorded, the external device can determine whether or not the data DAi and the data DBi are abnormal by reading the data DAi and the data DBi via the bus interface circuit 51 and comparing each value of the read data DAi and the data DBi with the value of the recorded data DMi. The external device can read the data DMi via the memory interface circuit 52 and compare the value of the read data DMi with the value of the recorded data DMi to determine whether or not the data DMi is abnormal.

As described above, the real-time clock module 1 of the first embodiment includes the data abnormality determination circuit 30-1 that compares the first data based on the data DM1 which is the adjustment data used for adjusting the oscillation frequency of the oscillation circuit 10 with the second data based on the data DM1 to determine whether or not at least one of the first data and the second data is abnormal. The first data is the data DA1 output from the setting register 21-1 loaded with the data DM1, and the second data is the data DB1 output from the comparison register 22-1 loaded with the data DM1. The real-time clock module 1 according to the first embodiment includes the flag register 41-1 that holds the data abnormality flag DF1 in which the first value indicating that the data DA1 and the data DB1 are normal or the second value indicating that at least one of the data DA1 and the data DB1 is abnormal is set, based on a signal from the data abnormality determination circuit 30-1. Therefore, according to the real-time clock module 1 of the first embodiment, it is possible to detect an abnormality occurring in at least one of the data DA1 and the data DB1, which are adjustment data used for adjusting the oscillation frequency.

The real-time clock module 1 according to the first embodiment includes a time register 42-1 that holds time information TS1 when the data abnormality flag DF1 is changed from the first value to the second value. Therefore, according to the real-time clock module 1 of the first embodiment, it is possible to detect the time when an abnormality has occurred in at least one of the data DA1 and the data DB1.

1-2. Second Embodiment

Hereinafter, for the real-time clock module 1 of the second embodiment, components similar to those in the first embodiment are denoted by the same reference numerals, descriptions similar to those in the first embodiment are omitted or simplified, and contents different from those in the first embodiment will be mainly described.

Figure 5:
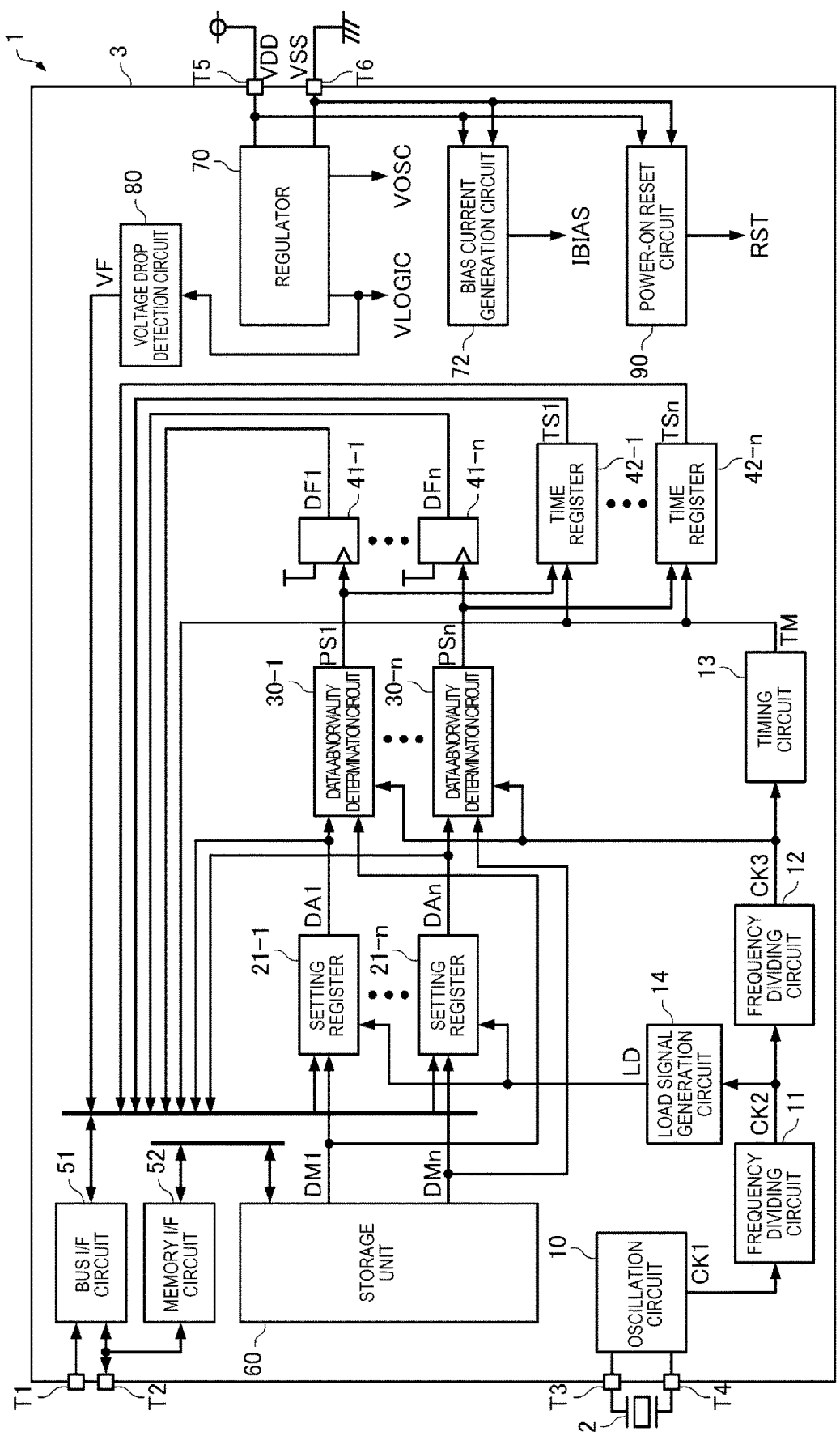
FIG. 5 is a functional block diagram of a real-time clock module according to a second embodiment.

FIG. 5 is a functional block diagram of the real-time clock module 1 of the second embodiment. As illustrated in FIG. 5, in the real-time clock module 1 of the second embodiment, the integrated circuit 3 does not have the comparison registers 22-1 to 22-n illustrated in FIG. 1.

In the second embodiment, when i is an arbitrary integer between 1 and n, the data abnormality determination circuit 30-i operates by using the voltage VLOGIC as a power supply voltage and compares the data DAi output from the setting register 21-i with the data DMi stored in the storage unit 60 in synchronization with the clock signal CK3 to determine whether or not at least one of the data DAi and the data DMi is abnormal. The data abnormality determination circuit 30-i outputs the pulse signal PSi when it is determined that at least one of the data DAi and the data DMi is abnormal. The specific configuration of the data abnormality determination circuit 30-i is the same as that in FIG. 3, and the data DBi may be replaced with the data DMi, and therefore illustration and description thereof are omitted.

Since the other configuration of the real-time clock module 1 of the second embodiment is the same as that of the first embodiment, description thereof is omitted.

In the example of FIG. 5, the setting register 21-1 corresponds to a □data register□. The data DA1 output from the setting register 21-1 is data based on the data DM1 that is adjustment data used for adjusting the oscillation frequency of the oscillation circuit 10 and corresponds to □first data□. The data DM1 stored in the storage unit 60 is adjustment data used for adjusting the oscillation frequency of the oscillation circuit 10 and corresponds to □second data□.

Figure 6:
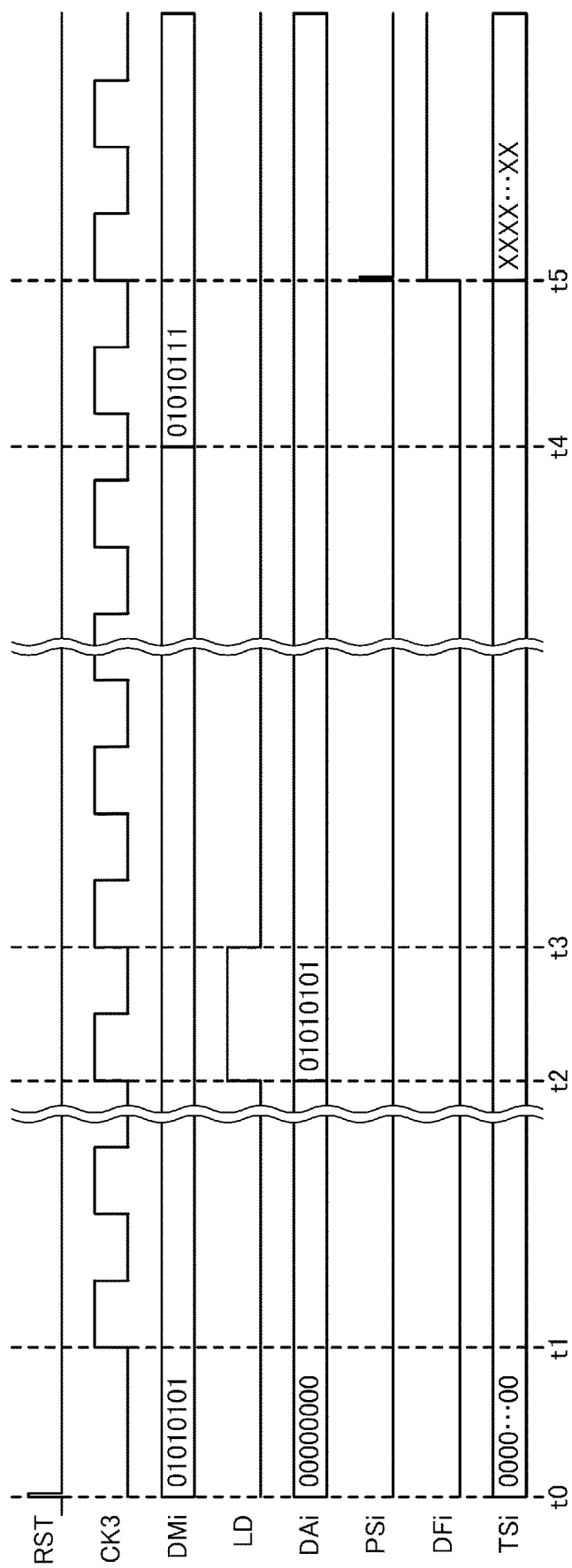
FIG. 6 is a timing chart illustrating an example of an operation of a data abnormality determination circuit in the second embodiment.

FIG. 6 is a timing chart illustrating an example of the operation of the data abnormality determination circuit 30-i in the second embodiment. i is an arbitrary integer from 1 to n. In the example of FIG. 6, the data DMi □01010101□ is stored in the storage unit 60.

First, the reset signal RST is generated at time t0. As a result, the data DAi is initialized to □00000000□. The load signal LD and the pulse signal PSi are each initialized to the low level. The data abnormality flag DFi is initialized to □0□. The time information TSi is initialized to □0000 . . . 00□.

Next, at time t1, the first pulse of the clock signal CK3 is generated. When a predetermined number of pulses of the clock signal CK3 are generated, the load signal LD changes from the low level to the high level at the rising edge of the clock signal CK3 at time t2. As a result, the data DMi is loaded into the setting register 21-i, and the data DAi changes from □00000000□ to □01010101□.

Next, at time t3, the load signal LD changes from the high level to the low level at the rising edge of the next pulse of the clock signal CK3.

Next, at time t4, a part of bit values of the data DMi changes for some reason, and when the data DMi changes from □01010101□ to □01010111□, at time t5, the pulse signal PSi is generated at the rising edge after two pulses of the clock signal CK3. As a result, the data abnormality flag DFi changes from □0□ to □1□, the timing data TM is captured into the time register 42-i, and the time information TSi changes from □0000 . . . 00□ to □XXXX□XX□.

For example, the external device can periodically read the data abnormality flag DFi via the bus interface circuit 51 and recognize that at least one of the data DAi and the data DMi is abnormal when the data abnormality flag DFi is first read after time t5. The external device can recognize the time when it is determined that at least one of the data DAi and the data DMi is abnormal, that is, the time when the reliability of the timing data TM has decreased, by reading the time information TSi via the bus interface circuit 51.

If the value of the data DMi stored in the storage unit 60 is recorded, the external device can determine whether or not the data DAi is abnormal by reading the data DAi via the bus interface circuit 51 and comparing the value of the read data DAi with the value of the recorded data DMi. The external device can read the data DMi via the memory interface circuit 52 and compares the value of the read data DMi with the value of the recorded data DMi to determine whether or not the data DMi is abnormal.

The real-time clock module 1 of the second embodiment described above includes the data abnormality determination circuit 30-1 that compares the first data based on the data DM1 which is the adjustment data used for adjusting the oscillation frequency of the oscillation circuit 10 with the second data based on the data DM1 to determine whether or not at least one of the first data and the second data is abnormal. The first data is the data DA1 output from the setting register 21-1 loaded with the data DM1, and the second data is the data DM1 that is adjustment data stored in the storage unit 60. The real-time clock module 1 according to the second embodiment includes the flag register 41-1 that holds the data abnormality flag DF1 in which the first value indicating that the data DA1 and the data DM1 are normal or the second value indicating that at least one of the data DA1 and the data DM1 is abnormal is set, based on a signal from the data abnormality determination circuit 30-1. Therefore, according to the real-time clock module 1 of the second embodiment, it is possible to detect that an abnormality has occurred in at least one of the data DA1 and the data DM1, which are adjustment data used for adjusting the oscillation frequency. In particular, according to the real-time clock module 1 of the second embodiment, even when a part of bit values of the data DM1 stored in the storage unit 60 changes due to noise or aging deterioration, an abnormality in the data DM1 can be detected.

The real-time clock module 1 according to the second embodiment includes a time register 42-1 that holds time information TS1 when the data abnormality flag DF1 is changed from the first value to the second value. Therefore, according to the real-time clock module 1 of the second embodiment, it is possible to detect the time when an abnormality has occurred in at least one of the data DA1 and the data DM1.

1-3. Third Embodiment

Hereinafter, for the real-time clock module 1 of the third embodiment, components similar to those in the first embodiment are denoted by the same reference numerals, descriptions similar to those in the first embodiment are omitted or simplified, and contents different from those in the first embodiment will be mainly described.

Figure 7:
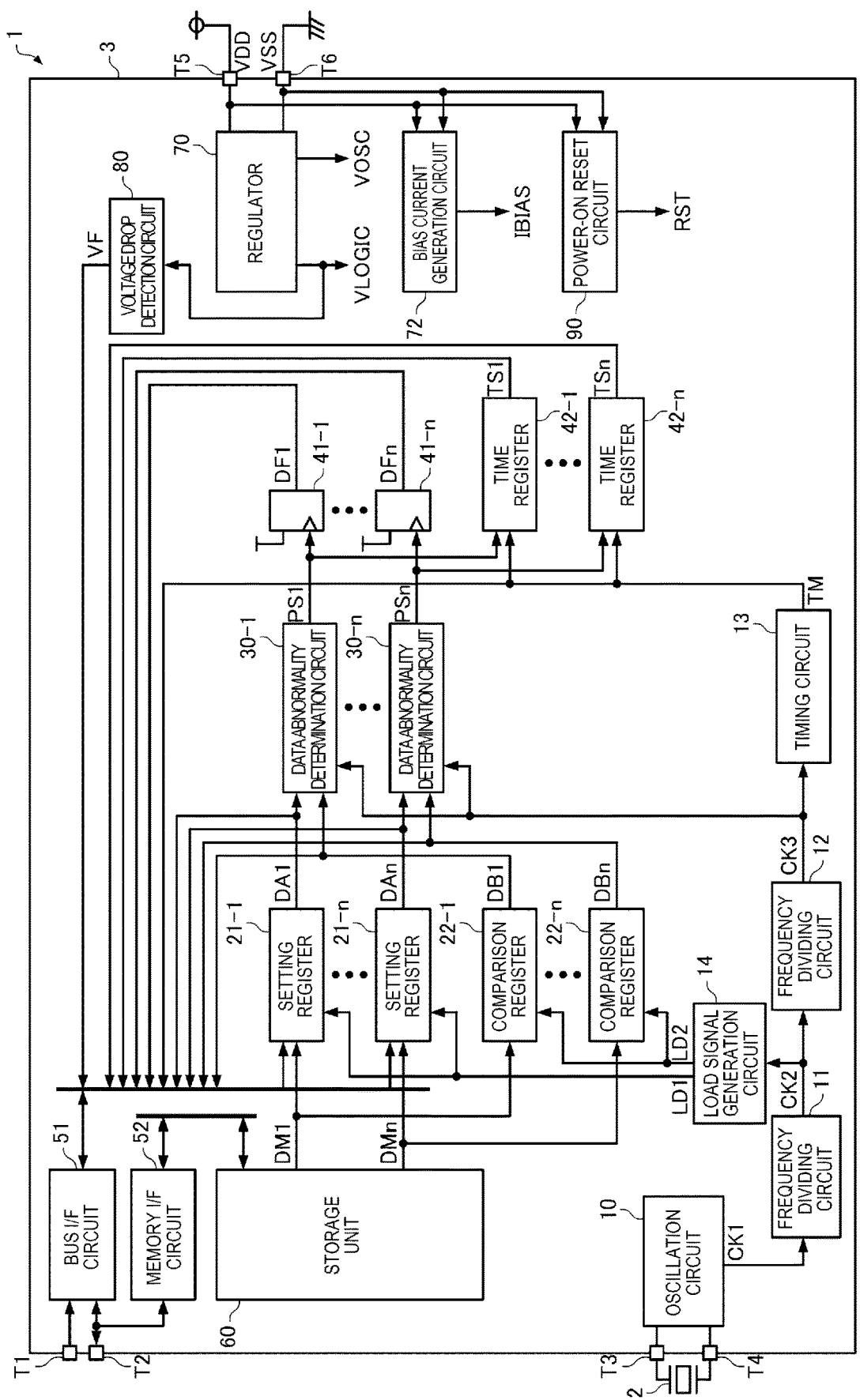
FIG. 7 is a functional block diagram of a real-time clock module according to a third embodiment.

FIG. 7 is a functional block diagram of the real-time clock module 1 of the third embodiment. As illustrated in FIG. 7, the real-time clock module 1 of the third embodiment is different from the real-time clock module 1 of the first embodiment illustrated in FIG. 1 in that the load signal generation circuit 14 is generating a load signal LD1 and a load signal LD2 in the integrated circuit 3.

Specifically, the load signal generation circuit 14 operates by using the voltage VLOGIC as a power supply voltage, counts the number of pulses of the clock signal CK2, and sets the load signal LD1 and the load signal LD2 to a high level for one pulse of the clock signal CK2. The time from when the load signal generation circuit 14 starts counting the number of pulses of the clock signal CK2 until the count value reaches the predetermined value is set to a time longer than the time required until the oscillation operation of the oscillation circuit 10 is stabilized after the supply of the power supply voltage VDD to the integrated circuit 3 is started.

The load signal generation circuit 14 repeatedly counts the number of pulses of the clock signal CK2, and sets the load signal LD2 to the high level for one pulse of the clock signal CK2 every time the count value reaches a predetermined value. That is, the load signal LD1 becomes the high level only once, while the load signal LD2 periodically becomes the high level.

In the third embodiment, when the load signal LD1 changes from the low level to the high level, n pieces of data DM1 to DMn are loaded into the setting registers 21-1 to 21-n, respectively. Accordingly, the data DM1 to DMn are loaded only once from the storage unit 60 to the setting registers 21-1 to 21-n, respectively.

When the load signal LD2 changes from the low level to the high level, n pieces of data DM1 to DMn are loaded into the comparison registers 22-1 to 22-n, respectively. Therefore, the data DM1 to DMn are periodically loaded from the storage unit 60 to the comparison registers 22-1 to 22-n, respectively.

Since the other configuration of the real-time clock module 1 of the third embodiment is the same as that of the first embodiment, description thereof is omitted.

In the example of FIG. 7, the setting register 21-1 corresponds to a □first data register□, and the comparison register 22-1 corresponds to a □second data register□.

The data DA1 output from the setting register 21-1 is data based on the data DM1 that is adjustment data used for adjusting the oscillation frequency of the oscillation circuit 10 and corresponds to □first data□. The data DB1 output from the comparison register 22-1 is data based on the data DM1 that is adjustment data used to adjust the oscillation frequency of the oscillation circuit 10 and corresponds to □second data□.

Figure 8:
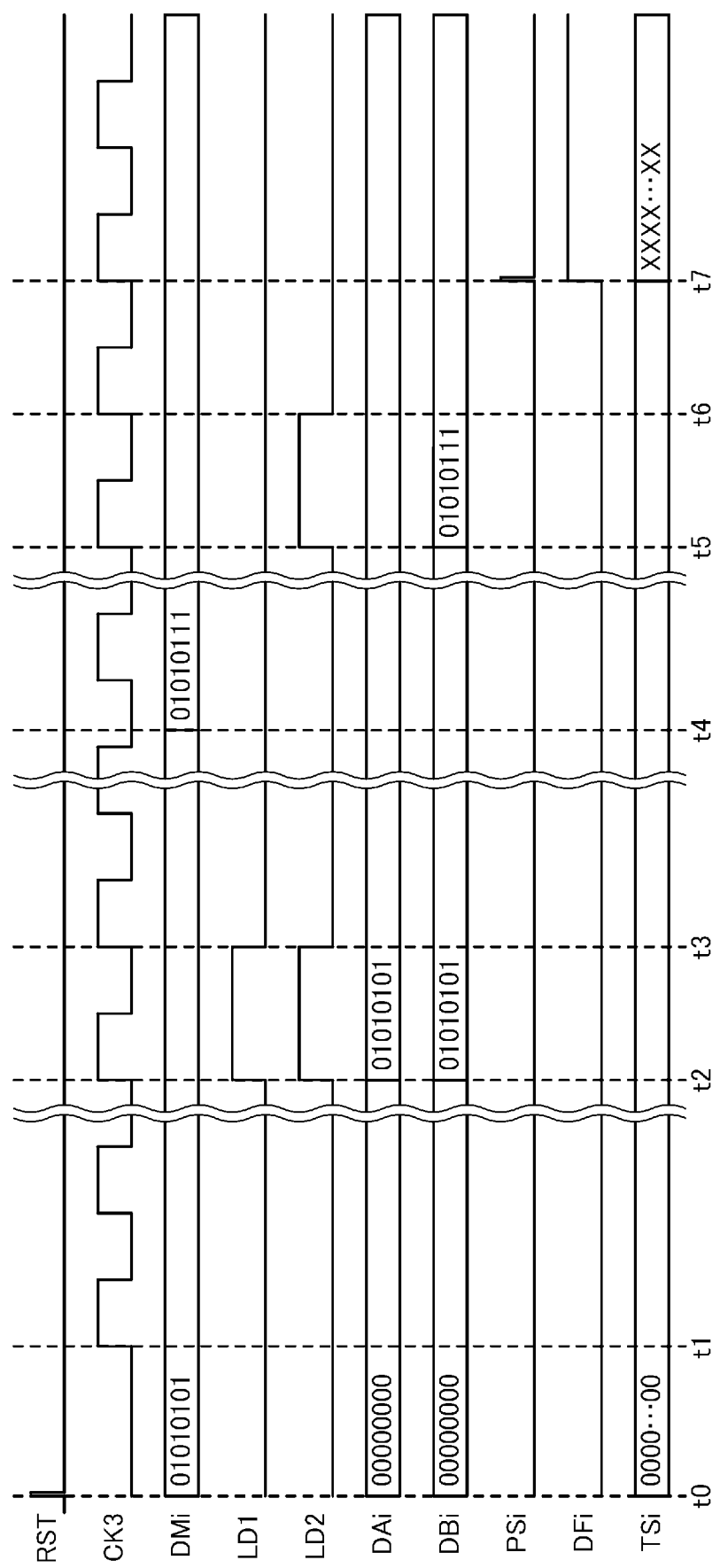
FIG. 8 is a timing chart illustrating an example of an operation of a data abnormality determination circuit in the third embodiment.

FIG. 8 is a timing chart illustrating an example of the operation of the data abnormality determination circuit 30-$i$ in the third embodiment. i is an arbitrary integer from 1 to n. In the example of FIG. 8, the data DMi □01010101□ is stored in the storage unit 60.

First, the reset signal RST is generated at time t0. As a result, the data DAi and the data DBi are initialized to □00000000□, respectively. The load signal LD1, the load signal LD2, and the pulse signal PSi are each initialized to a low level. The data abnormality flag DFi is initialized to □0□. The time information TSi is initialized to □0000 . . . 00□.

Next, at time t1, the first pulse of the clock signal CK3 is generated. Then, when a predetermined number of pulses of the clock signal CK3 are generated, at time t2, the load signal LD1 and the load signal LD2 change from the low level to the high level at the rising edge of the pulse of the clock signal CK3. As a result, the data DMi is loaded into the setting register 21-$i$ and the comparison register 22-$i$, respectively, and the data DAi and the data DBi change from □00000000□ to □01010101□, respectively.

Next, at time t3, the load signal LD1 and the load signal LD2 change from the high level to the low level at the rising edge of the next pulse of the clock signal CK3, respectively.

Next, at time t4, some bit values of the data DMi change due to some reason, and the data DMi changes from □01010101□ to □01010111□.

Then, when a predetermined number of pulses of the clock signal CK3 are generated after time t2, the load signal LD2 changes from the low level to the high level at the rising edge of the clock signal CK3 at time t5. As a result, the data DMi is loaded into the comparison register 22-$i$, and the data DBi changes from □01010101□ to □01010111□.

Next, at time t6, the load signal LD2 changes from the high level to the low level at the rising edge of the next pulse of the clock signal CK3.

Next, at time t7, the pulse signal PSi is generated at the rising edge of the next pulse of the clock signal CK3. As a result, the data abnormality flag DFi changes from □0□ to □1□, the timing data TM is captured into the time register 42-$i$, and the time information TSi changes from □0000 . . . 00□ to □XXXX□XX.

For example, the external device can periodically read the data abnormality flag DFi via the bus interface circuit 51 and recognize that at least one of the data DAi and the data DBi is abnormal when the data abnormality flag DFi is first read after time t7. The external device can recognize the time when it is determined that at least one of the data DAi and the data DBi is abnormal, that is, the time when the reliability of the timing data TM has decreased, by reading the time information TSi via the bus interface circuit 51.

If the value of the data DMi stored in the storage unit 60 is recorded, the external device can determine whether or not the data DAi and the data DBi are abnormal by reading the data DAi and the data DBi via the bus interface circuit 51 and comparing each value of the read data DAi and the data DBi with the value of the recorded data DMi. The external device can read the data DMi via the memory interface circuit 52 and compare the value of the read data DMi with the value of the recorded data DMi to determine whether or not the data DMi is abnormal.

The real-time clock module 1 of the third embodiment described above includes the data abnormality determination circuit 30-1 that compares the first data based on the data DM1 which is the adjustment data used for adjusting the oscillation frequency of the oscillation circuit 10 with the second data based on the data DM1 to determine whether or not at least one of the first data and the second data is abnormal. The first data is the data DA1 output from the setting register 21-1 loaded with the data DM1, and the second data is the data DB1 output from the comparison register 22-1 loaded with the data DM1 periodically. The real-time clock module 1 according to the third embodiment includes the flag register 41-1 that holds the data abnormality flag DF1 in which the first value indicating that the data DA1 and the data DB1 are normal or the second value indicating that at least one of the data DA1 and the data DB1 is abnormal is set, based on a signal from the data abnormality determination circuit 30-1. Therefore, according to the real-time clock module 1 of the third embodiment, it is possible to detect an abnormality occurring in at least one of the data DA1 and the data DB1, which are adjustment data used for adjusting the oscillation frequency. In particular, according to the real-time clock module 1 of the third embodiment, since the data DM1 is periodically loaded from the storage unit 60 to the comparison register 22-1, even when some of the bit values of the data DM1 stored in the storage unit 60 change due to noise or aging deterioration, the abnormality of the data DM1 can be detected.

The real-time clock module 1 according to the third embodiment includes a time register 42-1 that holds time information TS1 when the data abnormality flag DF1 is changed from the first value to the second value. Therefore, according to the real-time clock module 1 of the third embodiment, it is possible to detect the time when an abnormality has occurred in at least one of the data DA1 and the data DB1.

1-4. Fourth Embodiment

Hereinafter, for the real-time clock module 1 of the fourth embodiment, components similar to those in the first embodiment are denoted by the same reference numerals, descriptions similar to those in the first embodiment are omitted or simplified, and contents different from those in the first embodiment will be mainly described.

Figure 9:
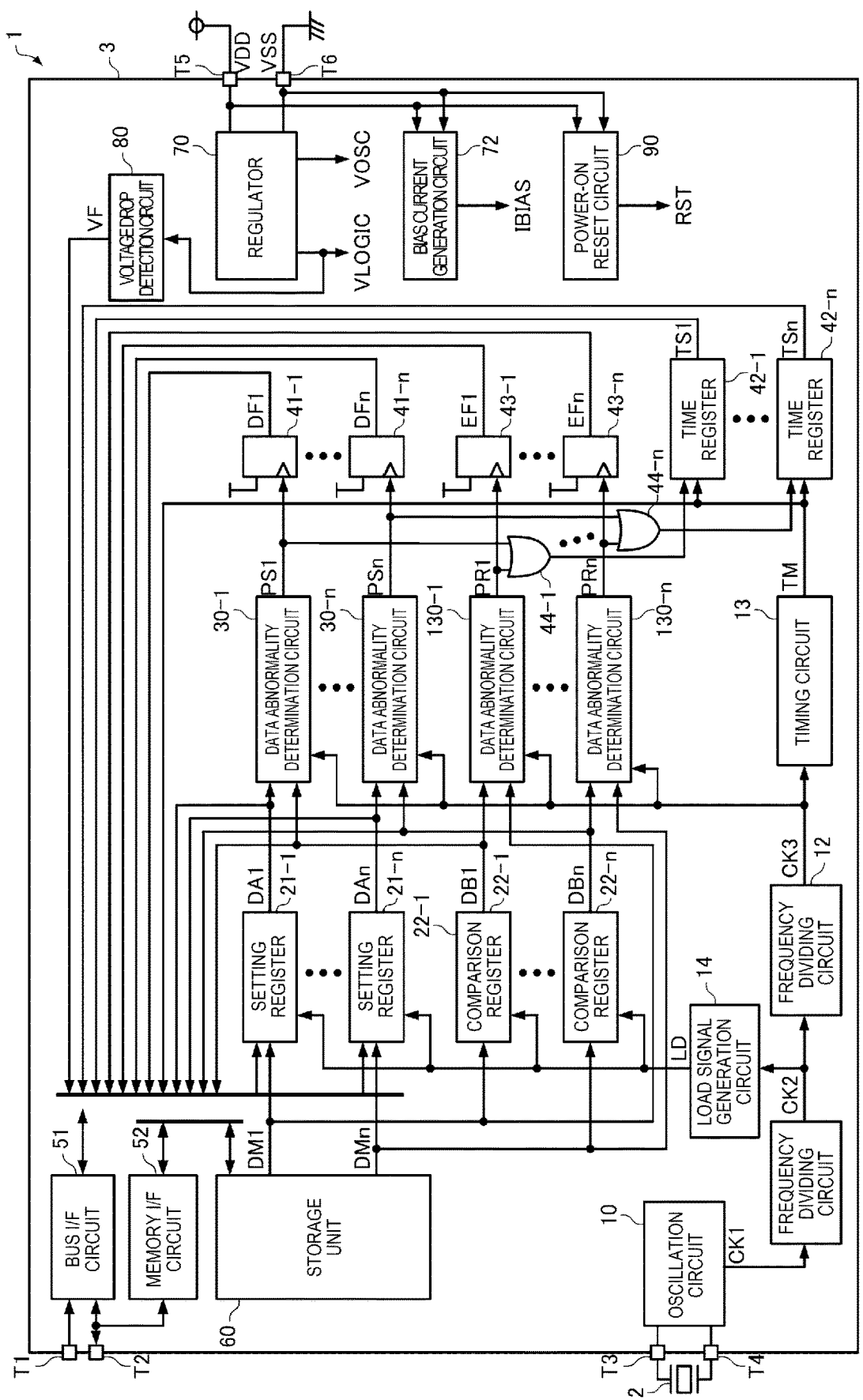
FIG. 9 is a functional block diagram of a real-time clock module according to a fourth embodiment.

FIG. 9 is a functional block diagram of the real-time clock module 1 of the fourth embodiment. As illustrated in FIG. 9, the real-time clock module 1 of the fourth embodiment is different from the real-time clock module 1 of the first embodiment illustrated in FIG. 1 in that n data abnormality determination circuits 130-1 to 130-n, n flag registers 43-1 to 43-n, and n OR circuits 44-1 to 44-n are added to the integrated circuit 3.

Figure 10:
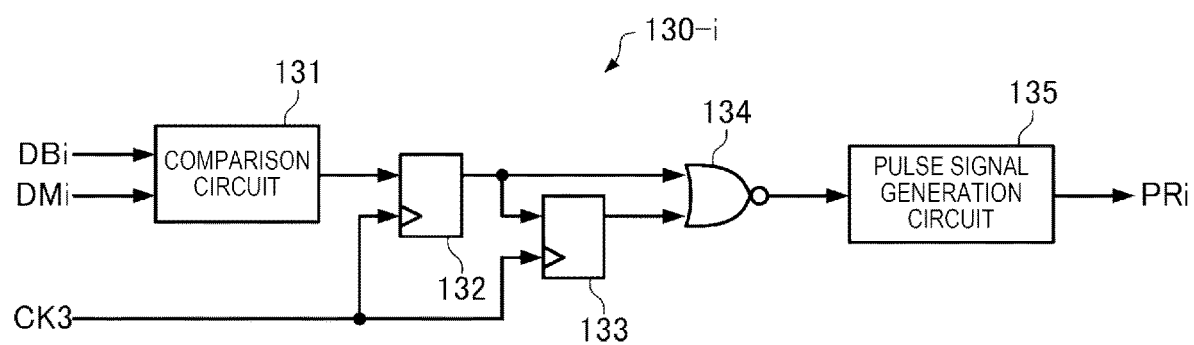
FIG. 10 is a diagram illustrating a configuration example of a data abnormality determination circuit.

When i is an arbitrary integer between 1 and n, the data abnormality determination circuit 130-i operates by using the voltage VLOGIC as a power supply voltage, compares the data DBi output from comparison register 22-i with the data DMi stored in the storage unit 60 in synchronization with the clock signal CK3, and determines whether or not at least one of the data DBi and the data DMi is abnormal. The data abnormality determination circuit 130-i outputs a pulse signal PRi when it is determined that at least one of the data DBi and the data DMi is abnormal. The circuit configurations of the data abnormality determination circuits 130-1 to 130-n may be the same. FIG. 10 is a diagram illustrating a configuration example of the data abnormality determination circuit 130-i. i is an arbitrary integer from 1 to n.

In the example of FIG. 10, the data abnormality determination circuit 130-i includes a comparison circuit 131, a flip-flop 132, a flip-flop 133, a NOR circuit 134, and a pulse signal generation circuit 135.

The comparison circuit 131 compares the data DBi with the data DMi, and outputs data that is at the high level when the data DBi and the data DMi match, and outputs data that is at the low level when the data DBi and the data DMi do not match.

The flip-flop 132 holds the data output from the comparison circuit 131 every time the pulse of the clock signal CK3 rises and outputs the held data.

The flip-flop 133 holds the data output from the flip-flop 132 every time the pulse of the clock signal CK3 rises and outputs the held data.

Although not illustrated, when the reset signal RST is at a high level, the data held by the flip-flops 132 and 133 is initialized to a high level.

The NOR circuit 134 outputs a signal that is at the low level when at least one of the data output from the flip-flop 132 and the data output from the flip-flop 133 is at the high level and outputs a signal that is at the high level when both the data output from the flip-flop 132 and the data output from the flip-flop 133 are at the low level. In a case where the data DBi and the data DMi do not match for one cycle of the clock signal CK3, the output signal of the NOR circuit 134 changes from the low level to the high level.

The pulse signal generation circuit 135 generates a pulse signal PRi that becomes the high level for a certain time when the output signal of the NOR circuit 134 changes from the low level to the high level. When the data DBi and the data DMi do not match, since the output signal of the NOR circuit 134 changes from the low level to the high level, the pulse signal generation circuit 135 generates the pulse signal PRi when the data DBi and the data DMi do not match. The fact that the data DBi and the data DMi do not match indicates that at least one of the data DBi and the data DMi is abnormal. Therefore, the data abnormality determination circuit 130-i generates the pulse signal PRi when it is determined that at least one of the data DBi and the data DMi is abnormal.

Returning to FIG. 9, when i is an arbitrary integer between 1 and n, the flag register 43-i operates by using the voltage VLOGIC as a power supply voltage and holds a data abnormality flag EFi in which a third value indicating that the data DBi and the data DMi are normal, or a fourth value indicating that at least one of the data DBi and the data DMi is abnormal is set, based on the signal from the data abnormality determination circuit 130-i. Specifically, the data abnormality flag EFi is changed from the third value to the fourth value based on the pulse signal PRi output from the data abnormality determination circuit 130-i. In the embodiment, the flag register 43-i is realized by a flip-flop that holds high-level data at the rising edge of the pulse signal PRi. Although not illustrated, when the reset signal RST is at the high level, the data held in the flag registers 43-1 to 43-n is initialized to the low level.

As described above, the data abnormality determination circuit 130-i generates the pulse signal PRi when it is determined that at least one of the data DBi and the data DMi is abnormal. Therefore, in the embodiment, the third value set in the data abnormality flag EFi and indicating that the data DBi and the data DMi are normal is □0□ corresponding to the low level. The fourth value set in the data abnormality flag EFi and indicating that at least one of the data DBi and the data DMi is abnormal is □0□ corresponding to the high level.

When i is an arbitrary integer between 1 and n, the OR circuit 44-i outputs a signal that is at the high level when at least one of the pulse signal PSi output from the data abnormality determination circuit 30-i and the pulse signal PRi output from the data abnormality determination circuit 130-i is at the high level and outputs a signal that is at the low level when both the pulse signal PSi and the pulse signal PRi are at the low level. Therefore, when the pulse signal PSi or the pulse signal PRi is generated, the output signal of the OR circuit 44-i changes from the low level to the high level.

When i is an arbitrary integer between 1 and n, the time register 42-i operates by using the voltage VLOGIC as a power supply voltage and-holds time information TSi when the data abnormality flag DFi is changed from the first value to the second value or when the data abnormality flag EFi is changed from the third value to the fourth value. Specifically, the time register 42-i captures the timing data TM at the rising edge of the output signal of the OR circuit 44-i, that is, at the rising edge of the pulse signal PSi or the rising edge of the pulse signal PRi and holds the data as the time information TSi. Therefore, if the data abnormality flag DFi is the second value or the data abnormality flag EFi is the fourth value, the time information TSi is information indicating the time when the data abnormality determination circuit 30-i determines that at least one of the data DAi and the data DBi is abnormal or the time when the data abnormality determination circuit 130-i determines that at least one of the data DBi and the data DMi is abnormal.

The bus interface circuit 51 can write data to the setting registers 21-1 to 21-n or read the timing data TM, the data DA1 to DAn, the data DB1 to DBn, the data abnormality flags DF1 to DFn, the data abnormality flags EF1 to EFn, the time information TS1 to TSn, and the like according to a command received from an external device (not illustrated).

Since the other configuration of the real-time clock module 1 of the fourth embodiment is the same as that of the first embodiment, description thereof is omitted.

In the example of FIG. 9, the setting register 21-1 corresponds to a □first data register□, and the comparison register 22-1 corresponds to a □second data register□.

The data abnormality determination circuit 30-1 corresponds to a □first data abnormality determination circuit□, and the data abnormality determination circuit 130-1 corresponds to a □second data abnormality determination circuit□. The flag register 41-1 corresponds to a □first flag register□, and the flag register 43-1 corresponds to a □second flag register□. The data DA1 output from the setting register 21-1 corresponds to □first data□, and the data DB1 output from the comparison register 22-1 corresponds to □second data□. The data DM1 stored in the storage unit 60 is adjustment data used to adjust the oscillation frequency of the oscillation circuit 10 and corresponds to □third data□. The data abnormality flag DF1 held by the flag register 41-1 corresponds to a □first data abnormality flag□, and the data abnormality flag EF1 held by the flag register 43-1 corresponds to a □second data abnormality flag□. The pulse signal generation circuit 35 included in the data abnormality determination circuit 30-1 corresponds to a □first pulse signal generation circuit□, and the pulse signal generation circuit 135 included in the data abnormality determination circuit 130-1 corresponds to a □second pulse signal generation circuit□. The pulse signal PS1 corresponds to a □first pulse signal□, and the pulse signal PR1 corresponds to a □second pulse signal□.

Figure 11:
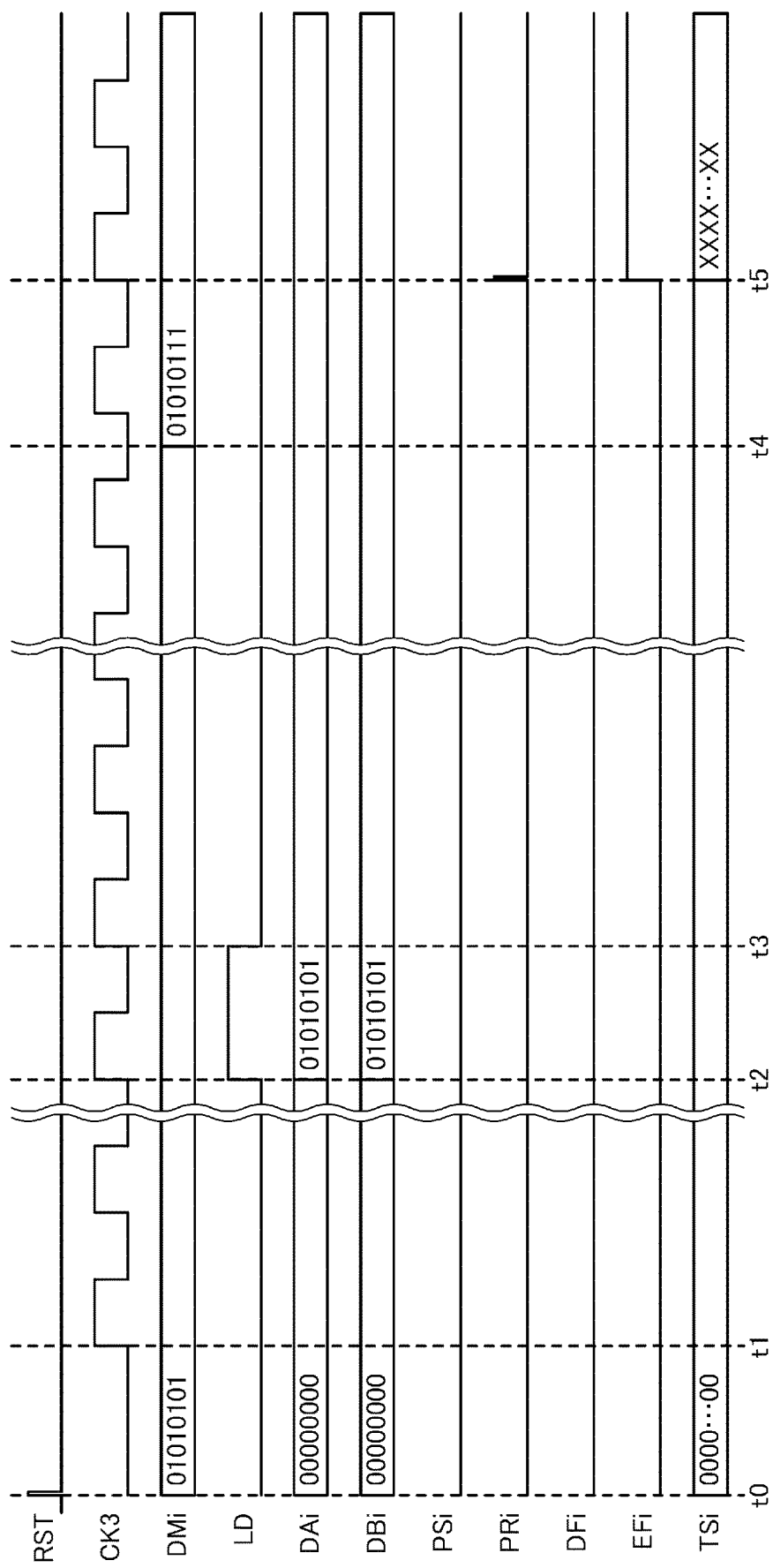
FIG. 11 is a timing chart illustrating an example of an operation of a data abnormality determination circuit in the fourth embodiment.

FIG. 11 is a timing chart illustrating an example of operations of the data abnormality determination circuit 30-i and the data abnormality determination circuit 130-i in the fourth embodiment. i is an arbitrary integer from 1 to n. In the example of FIG. 11, the data DMi □01010101□ is stored in the storage unit 60.

First, the reset signal RST is generated at time t0. As a result, the data DAi and the data DBi are initialized to □00000000□, respectively. The load signal LD, the pulse signal PSi, and the pulse signal PRi are each initialized to the low level. The data abnormality flag DFi and the data abnormality flag EFi are each initialized to □0□. The time information TSi is initialized to □0000 . . . 00□.

Next, at time t1, the first pulse of the clock signal CK3 is generated. When a predetermined number of pulses of the clock signal CK3 are generated, the load signal LD changes from the low level to the high level at the rising edge of the clock signal CK3 at time t2. As a result, the data DMi is loaded into the setting register 21-i and the comparison register 22-i, and the data DAi and the data DBi change from □00000000□ to □01010101□, respectively.

Next, at time t3, the load signal LD changes from the high level to the low level at the rising edge of the next pulse of the clock signal CK3.

Next, at time t4, a part of bit values of the data DMi changes for some reason, and when the data DMi changes from □01010101□ to □01010111□, at time t5, the pulse signal PRi is generated at the rising edge after two pulses of the clock signal CK3. As a result, the data abnormality flag EFi changes from □0□ to □1□, the timing data TM is captured into the time register 42-i, and the time information TSi changes from □0000 . . . 00□ to □XXXX□XX□.

For example, the external device can periodically read the data abnormality flag DFi and the data abnormality flag EFi via the bus interface circuit 51, recognize that the data DAi and the data DBi are normal when the data abnormality flag DFi is first read after the time t5, and recognize that at least one of the data DBi and the data DMi is abnormal when the data abnormality flag EFi is first read after time t5. That is, the external device can recognize that the data DMi is abnormal. By reading the time information TSi via the bus interface circuit 51, the external device can recognize the time when the data DMi is determined to be abnormal, that is, the time when the reliability of the timing data TM has decreased.

If the value of the data DMi stored in the storage unit 60 is recorded, the external device can determine whether or not the data DAi and the data DBi are abnormal by reading the data DAi and the data DBi via the bus interface circuit 51 and comparing each value of the read data DAi and the data DBi with the value of the recorded data DMi. The external device can read the data DMi via the memory interface circuit 52 and compare the value of the read data DMi with the value of the recorded data DMi to determine whether or not the data DMi is abnormal.

The real-time clock module 1 of the fourth embodiment described above includes the data abnormality determination circuit 30-1 that compares the data DA1 output from the setting register 21-1 loaded with the data DM1, which is adjustment data used to adjust the oscillation frequency of oscillation circuit 10, and the data DB1 output from the comparison register 22-1 loaded with the data DM1 to determine whether or not at least one of the data DA1 and the data DB1 is abnormal. The real-time clock module 1 of the fourth embodiment includes the data abnormality determination circuit 130-1 that compares the data DB1 output from the comparison register 22-1 with the data DM1 stored in the storage unit 60 to determine whether or not at least one of the data DB1 and the data DM1 is abnormal. The real-time clock module 1 according to the fourth embodiment includes the flag register 41-1 that holds the data abnormality flag DF1 in which the first value indicating that the data DA1 and the data DB1 are normal or the second value indicating that at least one of the data DA1 and the data DB1 is abnormal is set, based on a signal from the data abnormality determination circuit 30-1. The real-time clock module 1 according to the fourth embodiment includes the flag register 43-1 that holds the data abnormality flag EF1 in which the third value indicating that the data DB1 and the data DM1 are normal or the fourth value indicating that at least one of the data DB1 and the data DM1 is abnormal is set, based on a signal from the data abnormality determination circuit 130-1. Therefore, according to the real-time clock module 1 of the fourth embodiment, it is possible to detect an abnormality occurring in at least one of the data DA1, the data DB1, and the data DM1, which are adjustment data used for adjusting the oscillation frequency.

In particular, when the data abnormality flag DF1 is the first value and the data abnormality flag EF1 is the third value, it is determined that the data DA1, the data DB1, and the data DM1 are all normal. In a case where the data abnormality flag DF1 is the second value and the data abnormality flag EF1 is the third value, it is determined that the data DA1 is abnormal and the data DB1 and the data DM1 are normal. In a case where the data abnormality flag DF1 is the first value and the data abnormality flag EF1 is the fourth value, it is determined that the data DM1 is abnormal and the data DA1 and the data DB1 are normal. In a case where the data abnormality flag DF1 is the second value and the data abnormality flag EF1 is the fourth value, it is determined that the data DB1 is abnormal and the data DA1 and the data DM1 are normal. That is, according to the real-time clock module 1 of the fourth embodiment, it is possible to determine whether each of the data DA1, the data DB1, and the data DM1 is normal or abnormal based on the data abnormality flag DF1 and the data abnormality flag EF1.

The real-time clock module 1 according to the fourth embodiment includes the time register 42-1 that holds time information TS1 when the data abnormality flag DF1 is changed from the first value to the second value, or when the data abnormality flag EF1 is changed from the third value to the fourth value. Therefore, according to the real-time clock module 1 of the fourth embodiment, it is possible to detect the time when an abnormality has occurred in at least one of the data DA1, the data DB1, and the data DM1.

1-5. Modified Example

For example, in each of the above embodiments, the comparison circuit 31 or the comparison circuit 131 outputs data that is at the high level when the two pieces of data to be compared match and outputs data that is at the low level when the two pieces of data do not match, but data that is at the low level may be output when two pieces of data to be compared match, and data that is at the high level may be output when the two pieces of data do not match. In this case, the NOR circuit 34 or the NOR circuit 134 may be replaced with an AND circuit.

In each of the above embodiments, the pulse signal generation circuit 35 or the pulse signal generation circuit 135 generates a high-level pulse signal, but may generate a low-level pulse signal.

In each of the above embodiments, the data abnormality determination circuits 30-1 to 30-$n$ or the data abnormality determination circuits 130-1 to 130-$n$ determine whether or not two input data are abnormal each time one cycle of the clock signal CK3 elapses, but the time interval for this determination is not limited to the time of one cycle of the clock signal CK3. For example, this time interval may be one cycle of the clock signal obtained by dividing the frequency of the clock signal CK3, or one of a plurality of times may be selectable.

2. Electronic Device

Figure 12:
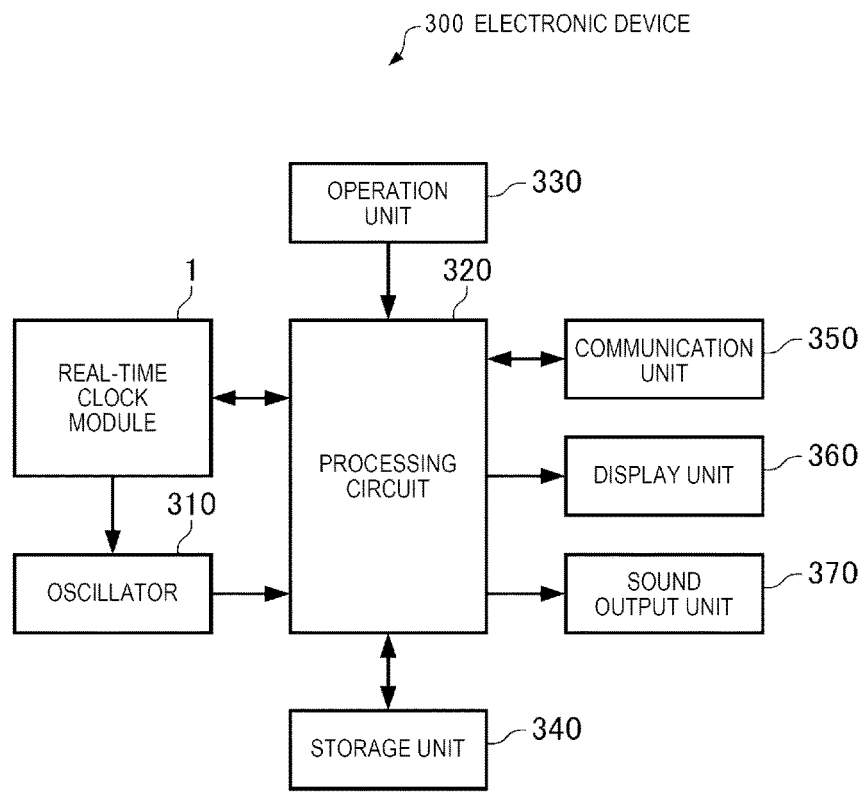
FIG. 12 is a functional block diagram of an embodiment of an electronic device.
Figure 13:
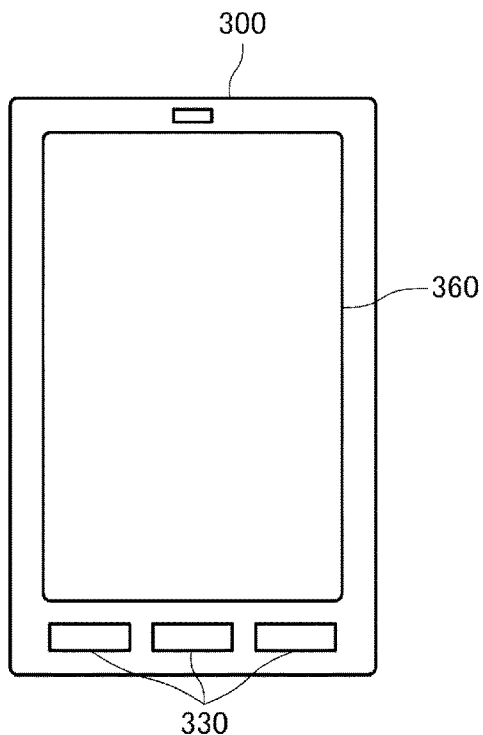
FIG. 13 is a diagram illustrating an example of an appearance of the embodiment of the electronic device.

FIG. 12 is a functional block diagram illustrating an example of the configuration of an embodiment of an electronic device using the real-time clock module 1 of each embodiment described above. FIG. 13 is a diagram illustrating an example of the appearance of a smartphone that is an example of the electronic device of the embodiment.

An electronic device 300 according to the embodiment includes the real-time clock module 1, an oscillator 310, a processing circuit 320, an operation unit 330, a storage unit 340, a communication unit 350, a display unit 360, and a sound output unit 370. The electronic device 300 of the embodiment may be configured such that some of the components in FIG. 12 are omitted or changed, or other components are added.

The processing circuit 320 operates by using the oscillation signal output from the oscillator 310 as a clock signal and performs various types of calculation processing and control processing in accordance with a program stored in the storage unit 340 or the like. Specifically, the processing circuit 320 performs various types of processing according to operation signals from the operation unit 330, processing of controlling the communication unit 350 for performing data communication with other devices, processing of transmitting a display signal for displaying various types of information on the display unit 360, processing of transmitting a sound signal for outputting various types of sound from the sound output unit 370, and the like. The processing circuit 320 operates based on the output signal from the real-time clock module 1. Specifically, the processing circuit 320 performs various settings for the real-time clock module 1 and reads timing data from the real-time clock module 1 to perform various kinds of calculation processing and control processing. The processing circuit 320 is realized by, for example, a micro-controller unit (MCU) or a microprocessor unit (MPU).

The operation unit 330 is an input device including operation keys, button switches, and the like and outputs an operation signal corresponding to a user operation to the processing circuit 320. The processing circuit 320 can set time information in the real-time clock module 1 in accordance with a signal input from the operation unit 330, for example.

The storage unit 340 stores programs, data, and the like for the processing circuit 320 to perform various types of calculation processing and control processing. The storage unit 340 is used as a work area of the processing circuit 320 and temporarily stores programs and data read from the storage unit 340, data input from the operation unit 330, calculation results executed by the processing circuit 320 according to various programs, and the like. The storage unit 340 is configured to include a read only memory (ROM) and a random-access memory (RAM) and is realized by, for example, a hard disk, flexible disk, MO, MT, various memories, CD-ROM, DVD-ROM, or the like.

The communication unit 350 performs various controls for establishing data communication between the processing circuit 320 and an external device.

The display unit 360 is a display device configured by a liquid crystal display (LCD) or the like and displays various types of information based on a display signal input from the processing circuit 320. The display unit 360 may be provided with a touch panel that functions as the operation unit 330.

The sound output unit 370 is configured by a speaker or the like and outputs various types of information as sound or voice based on the sound signal input from the processing circuit 320.

Since the electronic device 300 of the embodiment includes the real-time clock module 1 of each of the embodiments described above, it is possible to detect an abnormality occurring in the adjustment data used for adjusting the oscillation frequency, and high reliability can be realized.

Various electronic devices can be considered as such an electronic device 300, and examples thereof include personal computers such as electronic pieces, mobile computers, laptop computers, and tablet computers, mobile terminals such as smartphones and mobile phones, digital cameras, ink jet dispensing devices such as ink jet printers, storage area network devices such as routers and switches, local area network equipment, mobile terminal base station equipment, TV, video cameras, video recorders, car navigation devices, real-time clock devices, pagers, electronic notebooks, electronic dictionaries, calculators, electronic game machines, game controllers, word processors, workstations, video phones, crime prevention TV monitors, electronic binoculars, POS terminals, medical equipment such as electronic thermometers, blood pressure monitors, blood glucose meters, electrocardiogram measuring devices, ultrasound diagnostic devices, and electronic endoscopes, fish detectors, measuring instruments, instruments for vehicles, aircraft, and ships, flight simulators, head mounted displays, motion tracers, motion trackers, motion controllers, pedestrian dead reckoning (PDR) systems, and the like.

3. Vehicle

Figure 14:
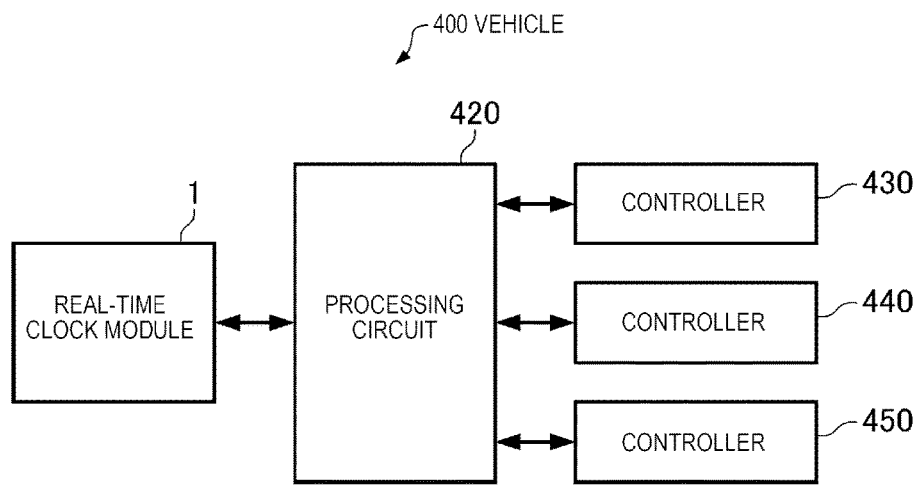
FIG. 14 is a functional block diagram of an embodiment of a vehicle.
Figure 15:
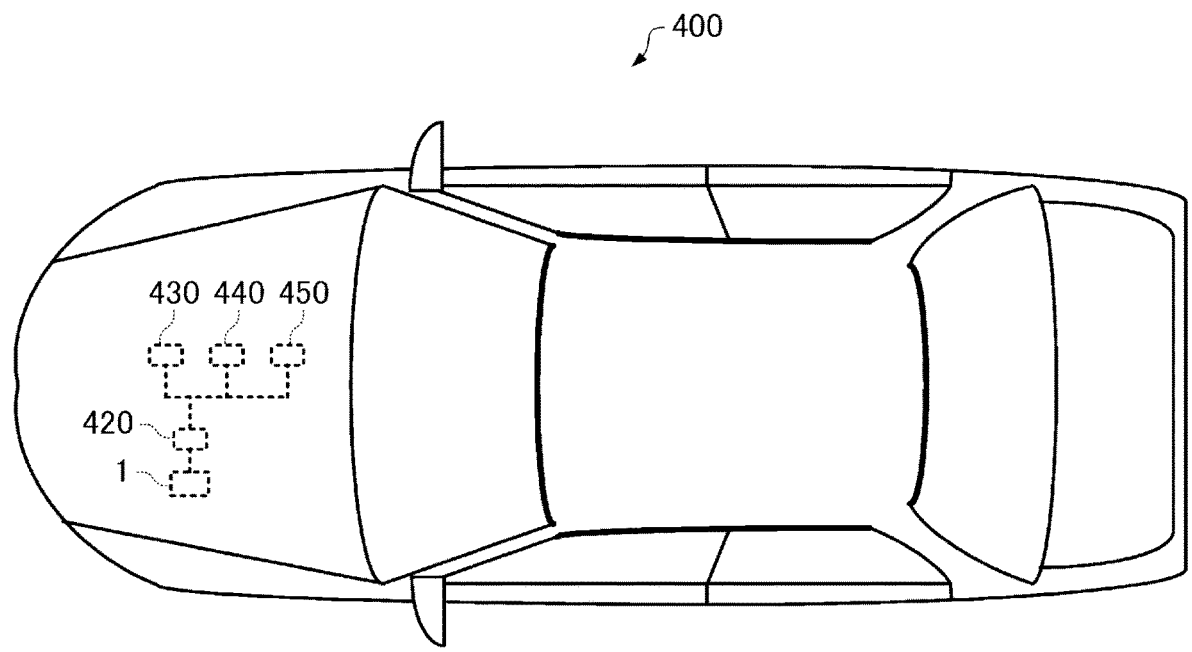
FIG. 15 is a diagram illustrating an example of an embodiment of the vehicle.

FIG. 14 is a functional block diagram illustrating an example of the configuration of an embodiment of a vehicle using the real-time clock module 1 of each embodiment described above. FIG. 15 is a diagram illustrating an example of a vehicle according to the present embodiment. A vehicle 400 of this embodiment includes the real-time clock module 1, a processing circuit 420, and controllers 430, 440, and 450. The vehicle according to the embodiment may have a configuration in which some of the components illustrated in FIGS. 14 and 15 are omitted or other components are added.

The processing circuit 420 performs various types of calculation processing and control processing in accordance with a program stored in a storage unit (not illustrated). Specifically, the processing circuit 420 performs processing for controlling the controllers 430, 440, and 450. The processing circuit 420 operates based on the output signal from the real-time clock module 1. Specifically, the processing circuit 420 performs various settings for the real-time clock module 1 and reads timing data from the real-time clock module 1 to perform various kinds of calculation processing and control processing.

The controllers 430, 440, and 450 perform various controls such as an engine system, a brake system, and a keyless entry system with respect to the vehicle 400, for example.

Since the vehicle 400 of the embodiment includes the real-time clock module 1 of each of the embodiments described above, it is possible to detect an abnormality occurring in the adjustment data used for adjusting the oscillation frequency, and high reliability can be realized.

As such a vehicle 400, various vehicles can be considered, and examples thereof include automobiles such as electric cars, aircraft such as jets and helicopters, ships, rockets, and artificial satellites.

The disclosure is not limited to the embodiment, and various modification examples can be made within the scope of the gist of the disclosure.

The above-described embodiments and modifications are merely examples, and the disclosure is not limited thereto. For example, it is possible to appropriately combine each embodiment and each modification example.

The disclosure includes substantially the same configuration as the configuration described in the embodiments (for example, a configuration having the same function, method, and result, or a configuration having the same object and effect). In addition, the disclosure includes a configuration in which non-essential parts of the configuration described in the embodiments are replaced. In addition, the disclosure includes a configuration that achieves the same effects as the configurations described in the embodiments or a configuration that may achieve the same object. In addition, the disclosure includes a configuration in which well-known techniques are added to the configurations described in the embodiments.

What is claimed is:

1. A real-time clock module comprising:
an oscillation circuit;
a storage unit that stores adjustment data used to adjust an oscillation frequency of the oscillation circuit;
a data abnormality determination circuit that compares first data based on the adjustment data with second data based on the adjustment data to determine whether or not at least one of the first data and the second data is abnormal; and
a flag register that holds a data abnormality flag in which a first value indicating that the first data and the second data are normal, or a second value indicating that at least one of the first data and the second data is abnormal is set, based on a signal from the data abnormality determination circuit.

2. The real-time clock module according to claim 1, further comprising:
a first data register to which the adjustment data is loaded from the storage unit; and
a second data register to which the adjustment data is loaded from the storage unit, wherein
the first data is data output from the first data register, and
the second data is data output from the second data register.

3. The real-time clock module according to claim 2, wherein
the adjustment data is periodically loaded from the storage unit to the second data register.

4. The real-time clock module according to claim 1, further comprising:
a data register to which the adjustment data is loaded from the storage unit, wherein
the first data is data output from the data register, and
the second data is the adjustment data stored in the storage unit.

5. The real-time clock module according to claim 1, further comprising:

a time register that holds time information when the data abnormality flag is changed from the first value to the second value.

6. The real-time clock module according to claim 1, wherein
the data abnormality determination circuit includes a pulse signal generation circuit that generates a pulse signal when the first data and the second data do not match, and
the data abnormality flag is changed from the first value to the second value based on the pulse signal.

7. A real-time clock module comprising:
an oscillation circuit;
a storage unit that stores adjustment data used to adjust an oscillation frequency of the oscillation circuit;
a first data register to which the adjustment data is loaded from the storage unit;
a second data register to which the adjustment data is loaded from the storage unit;
a first data abnormality determination circuit that compares first data output from the first data register with second data output from the second data register to determine whether or not at least one of the first data and the second data is abnormal;
a second data abnormality determination circuit that compares the second data with third data which is the adjustment data stored in the storage unit to determine whether or not at least one of the second data and the third data is abnormal;
a first flag register that holds a first data abnormality flag in which a first value indicating that the first data and the second data are normal, or a second value indicating that at least one of the first data and the second data is abnormal is set, based on a signal from the first data abnormality determination circuit; and
a second flag register that holds a second data abnormality flag in which a third value indicating that the second data and the third data are normal, or a fourth value indicating that at least one of the second data and the third data is abnormal is set, based on a signal from the second data abnormality determination circuit.

8. The real-time clock module according to claim 7, further comprising:
a time register that holds time information when the first data abnormality flag is changed from the first value to the second value or when the second data abnormality flag is changed from the third value to the fourth value.

9. The real-time clock module according to claim 7, wherein
the first data abnormality determination circuit includes a first pulse signal generation circuit that generates a first pulse signal when the first data and the second data do not match,
the second data abnormality determination circuit includes a second pulse signal generation circuit that generates a second pulse signal when the second data and the third data do not match,
the first data abnormality flag is changed from the first value to the second value based on the first pulse signal, and
the second data abnormality flag is changed from the third value to the fourth value based on the second pulse signal.

10. An electronic device comprising:
the real-time clock module according to claim 1; and
a processing circuit that operates based on an output signal from the real-time clock module.

11. A vehicle comprising:
the real-time clock module according to claim 1; and
a processing circuit that operates based on an output signal from the real-time clock module.

* * * * *